United States Patent [19]

Sunazuka et al.

[11] Patent Number: 4,654,865
[45] Date of Patent: Mar. 31, 1987

[54] CCD DEVICE WITH ELECTROSTATIC PROTECTIVE MEANS

[75] Inventors: Makoto Sunazuka; Mitsuo Oshima, both of Tokyo, Japan

[73] Assignee: Oki Electric Industry Co., Ltd., Tokyo, Japan

[21] Appl. No.: 768,818

[22] Filed: Aug. 23, 1985

[30] Foreign Application Priority Data

Aug. 27, 1984 [JP]  Japan ................................. 59-176834

[51] Int. Cl.[4] ...................... G11C 19/28; H01L 29/78; H02H 9/04
[52] U.S. Cl. ........................................ 377/62; 357/24; 357/51; 307/200 B; 361/56; 361/111
[58] Field of Search .............................. 357/24, 41, 51; 377/57–63; 307/200 B; 361/56, 91, 111

[56] References Cited

U.S. PATENT DOCUMENTS 4,456,939  6/1984  Ozaki .................................... 361/56

Primary Examiner—Gene M. Munson
Attorney, Agent, or Firm—Wenderoth, Lind & Ponack

[57] ABSTRACT

A CCD device includes a substrate, a gate insulating film formed on the surface of the semiconductor substrate, a plurality of charge transfer gate electrodes formed on the gate insulating film and divided for use into n groups of electrodes, a plurality of signal lines for electrically connecting a plurality of the transfer gate electrodes in each group of transfer gate electrodes for each integer number of electrodes, a plurality of clock signal lines to which a clock signal is applied, and a protective circuit for protecting a plurality of the gate insulating film against static electricity between the clock signal line and the signal line connected to the gate electrode. The CCD device can set a higher electrostatic withstanding voltage of the gate insulating film without reducing its clock operating speed. In addition, the CCD device allows no localized heating to be produced in the CCD IC chip because a protective resistor of the protective circuit is dispersed and arranged in the chip, thus reducing variations in the dark current.

8 Claims, 5 Drawing Figures

CCD DEVICE WITH ELECTROSTATIC PROTECTIVE MEANS

BACKGROUND OF THE INVENTION

1. Field of the Invention

The present invention relates to a charge coupled device (CCD), more particularly to a CCD device capable of preventing transfer gate electrodes from being destroyed by static electricity.

2. Description of the Prior Art

In recent years, a CCD device has been applied to solid image pickup devices, signal delay devices, and analog memory devices and so on.

A CCD is essentially an analog shift register, in which a group of signal charges stored in a potential well can be successively transferred as a piece of information by controlling the potential in a silicon substrate with use of clock pulses applied to transfer gate electrodes.

Operation of a CCD has been disclosed, for example, in Japanese Laid-Open Publication No. 21334/77. FIG. 1 shows a prior art two-phase driving CCD.

In FIG. 1, the CCD includes a gate insulating film 102 provided on the surface of a silicon substrate 100, a plurality of first layer polysilicon gate electrodes 104 provided on the surface of the gate insulating film 102, and a plurality of second layer polysilicon gate electrodes 106. An impurity diffusion layer 108 is formed on the silicon substrate 100 under the second layer polysilicon gate electrodes 106. A potential difference $\Delta\psi$ is produced in the silicon substrate 100 when the first and second polysilicon gate electrodes 104 and 106 are placed at the same potential.

The first polysilicon electrodes 104 and the second polysilicon electrodes 106 are connected with each other as a set of transfer gate electrodes 110. These sets of transfer gate electrodes 110 are alternately connected to clock signal lines 112 and 114 which are then connected to pin terminals 116 and 118 of an IC package. A signal charge 120 is transferred in a direction of the arrow A by applying clock pulses $\phi$, $\bar{\phi}$ to the transfer gate electrode 110.

The CCD is generally a MOS structure so that the input impedance of the clock signal lines is very high. Thus, the gate oxide film is liable to be destroyed when a high electrical field is applied between the gate electrode and the substrate due to static electricity.

Consequently, generally for the CCD, a circuit 122 for preventing electrostatic breakdown thereof is connected between the clock signal lines 112 and 116, and between the clock signal terminals 114 and 118, as shown in FIG. 1. The protective circuit 122 decribed above is constructed of a clamping diode 126 and a current-limiting protective resistance 124. With a resistor R and the diode D both providing a small time constant in the protective ciruit, a high voltage pulse on the clock signal line is clamped by the diode D, thus avoiding direct application of the high voltage pulse to the gate electrode. Thus, the gate insulating film 102 can be prevented from being destroyed.

Generally, the maximum withstanding voltage against static electricity is made higher as the value of the protective resistance made higher. FIG. 4 (I) shows a maximum electrostatic withstanding voltage characteristic of the gate insulating film having thickness of about 500 Å.

However, when the capacity of the CCD is made larger, many of the transfer gate electrodes are connected to the clock signal lines, so that input capacity C is increased to for example several hundreds of several thousands of pF, allowing the time constant of the protective circuit to be increased, thereby giving rise to a problem in that the protective circuit can not sufficiently protect the gate insulating film against a high voltage pulse caused by static electricity.

It is possible in view of resolving the problem to improve gate withstanding voltage against static electricity by increasing a value of the protective resistor as shown in FIG. 4(I), but this causes the clock operating speed of the CCD to be reduced as shown in FIG. 4(II).

SUMMARY OF THE INVENTION

An object of the present invention is to provide a CCD device having an improved electrostatic withstanding voltage without reducing its operating speed.

Another object of the present invention is to provide a CCD device containing a plurality of electrostatic protective circuits therein.

A still further object of the present invention is to provide a two-phase drive type CCD device having a higher electrostatic withstanding voltage characteristic and a better operating characteristic.

According to the present invention, the CCD device includes a semiconductor substrate, a gate insulating film formed on the surface of the semiconductor subsrate, a plurality of charge transfer gate electrodes formed on the gate insulating film and divided into n groups, a plurality of signal lines for electrically connecting a plurality of the charge transfer gate electrodes in each of the groups for each integer number thereof, a plurality of clock signal lines to each of which a clock signal is applied, and a means connected between the clock signal line and the gate electrode for protecting a plurality of the gate insulating films against static electricity.

The above and other objects, features and advantages of the invention will be more apparent from the following detailed description taken in conjunction with the accompanying drawings.

DESCRIPTION OF THE PREFERRED EMBODIMENT

An embodiment of a 4096 bit two-phase drive type CCD device according to the present invention will be described below with reference to FIGS. 2 and 3.

Figure 2:
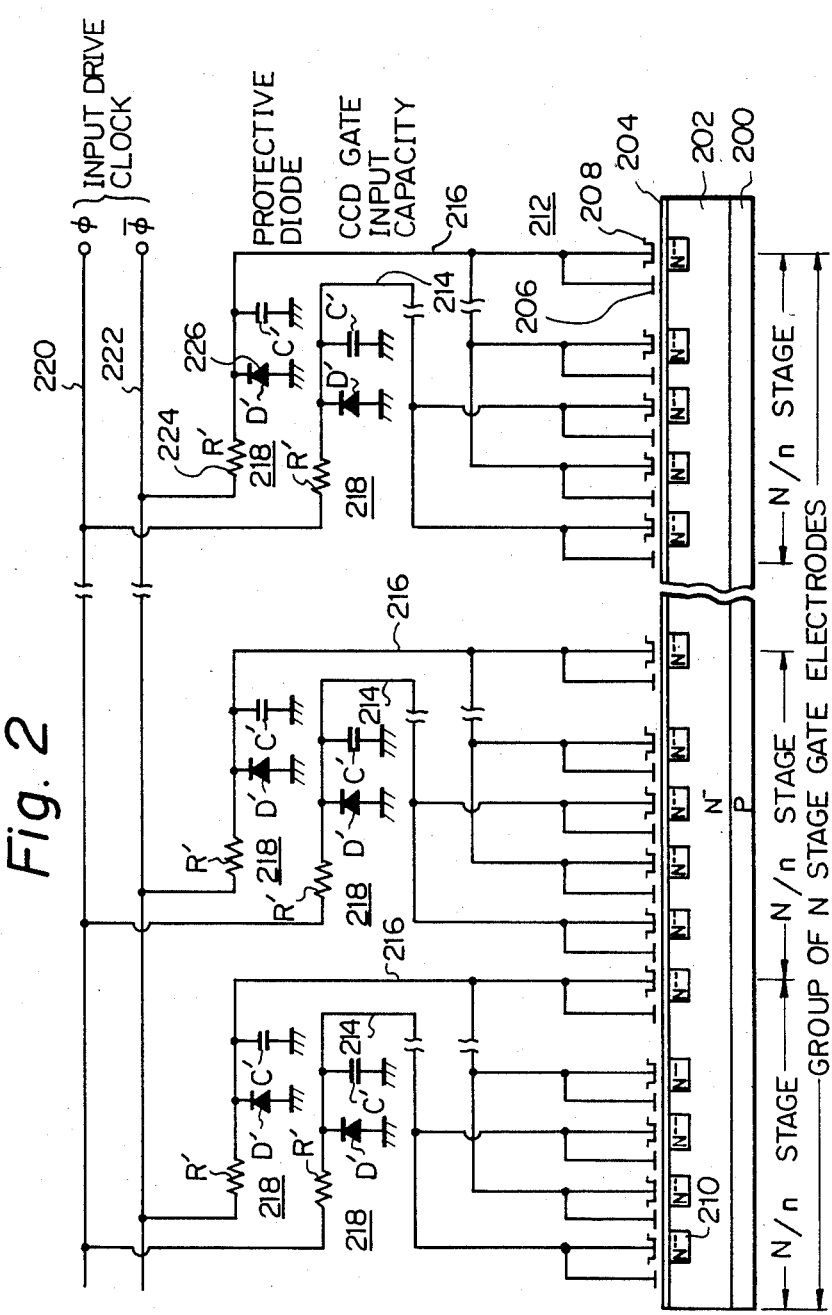
FIG. 2 is an equivalent circuit illustrating a two-phase drive type CCD having an electrostatic protective means according to the present invention.
Figure 3:
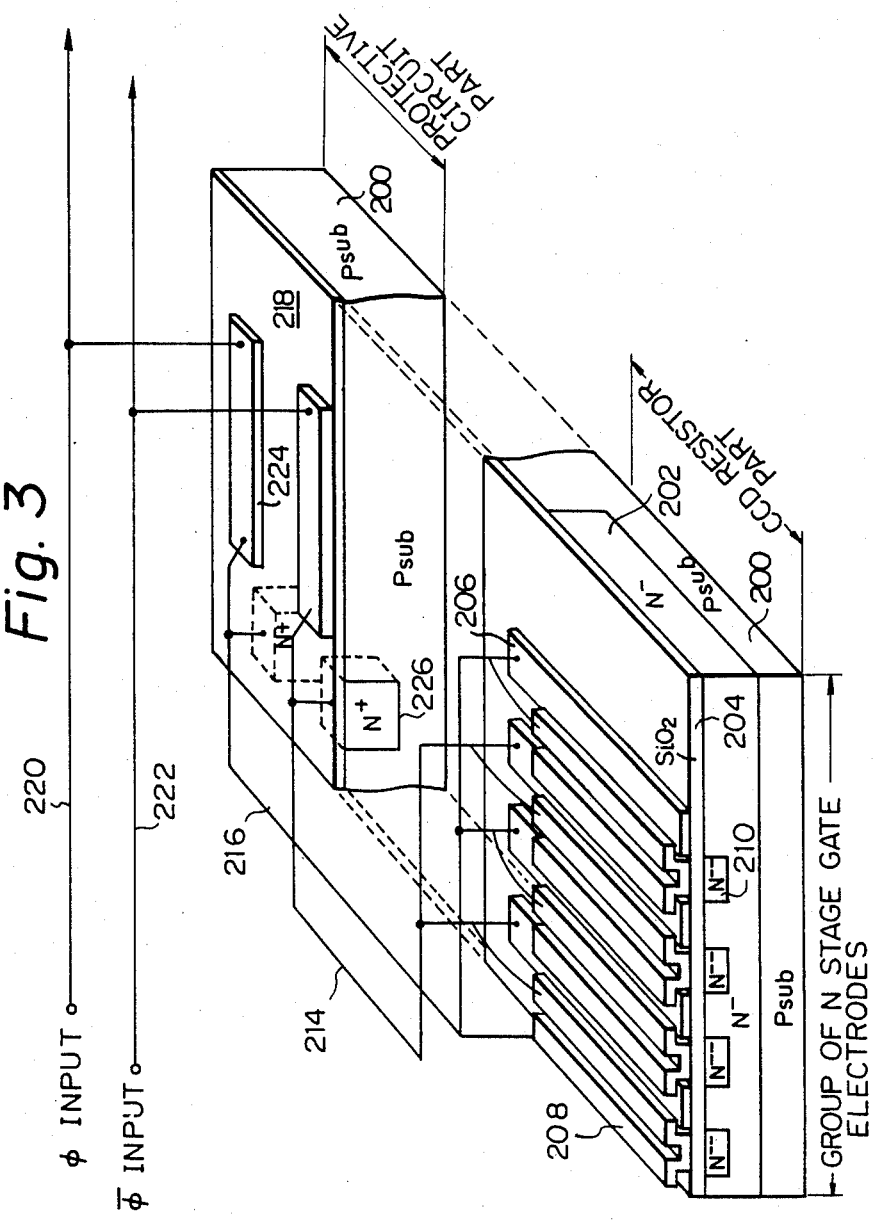
FIG. 3 is a perspective view illustrating a two-phase drive type CCD according to the present invention.

In FIG. 2, the CCD device includes a P type silicon substrate 200 having a concentration of about $1 \times 10^{15}/cm^3$, an N$^-$ diffusion layer 202 having a concentration of about $1\times10^{15}/cm^3$ formed on the P type silicon substrate 200, and a gate insulating film 204 having a thickness of, for example, about 500 Å and comprising a silicon oxide formed on the diffusion layer 202.

For example, 4096 first polysilicon electrodes 206 and 4096 second polysilicon electrodes 208 are rectilinearly arranged on the gate insulating layer 204.

An $N^-$ diffusion layer with a concentration of for example, about $5\times10^{15}/cm^3$ for producing a potential difference $\Delta\psi$ is formed on the surface of the $N^-$ diffusion layer 202 beneath the second polysilicon electrode 208.

The first layer polysilicon electrodes 206 and the second layer polysilicon electrodes 208 are mutually connected as a set of transfer gate electrodes 212. For example, 4096 sets of transfer gate electrodes are constructed.

These 4096 sets of gate electrodes are divided into n, for example 8, groups of 512 sets of the transfer gates, constituting 8 gate electrode groups in this instance.

Each set of gate electrodes in each group of gate electrodes are alternately and mutually connected, and connected to a pair of the signal lines 214 and 216.

The pair of the signal lines 214 and 216 are respectively connected to the clock signal lines 220 and 222 via an electrostatic protective means 218.

The electrostatic protective means 218 is constituted by the protective resistor 224 of about 100 to 200Ω and the PN junction diode 226 as shown in FIG. 2. for example, a phosphor doped polysilicon material, and the clamping diode 226 formed by for example, a material with a concentration of about $1\times10^{18}/cm^3$ doped in the P type silicon substrate 200. In addition, the signal lines 214 and 216 are formed by an aluminum wire.

Figure 1:
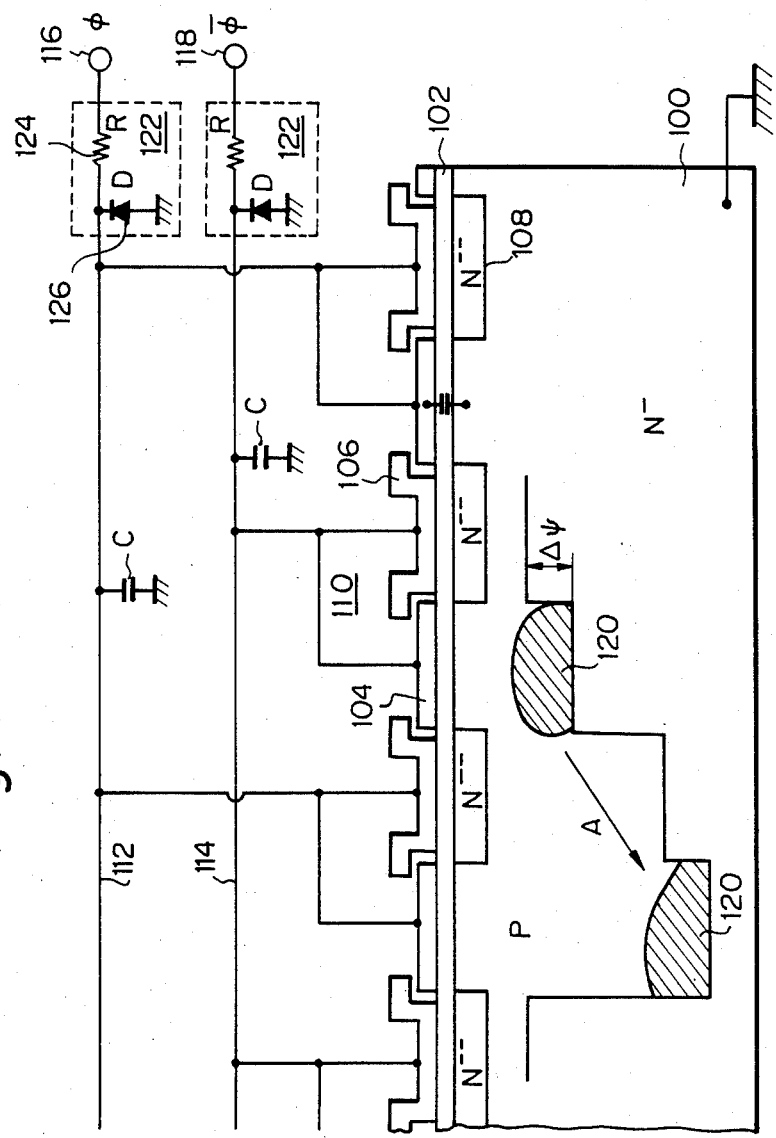
FIG. 1 is an equivalent circuit diagram illustrating a prior art two-phase drive type CCD having electrostatic protective means.

According to the present invention, a large parasitic capacitance C (e.g., 800 pF) associated with the signal lines 220 and 221 is shared so as to reduce its effective value to $1/n$ ($\frac{1}{8}$ in this embodiment) at signal lines 214 and 216. If the protective resistor 224 is maintained at the same resistance value as that in the conventional CCD shown in FIG. 1, the time constant of the protective circuit 218 will become lower. This results in high speed clock operation of CCDs without degrading the electrostatic withstanding voltage characteristic of the gate insulating layer.

Figure 4:
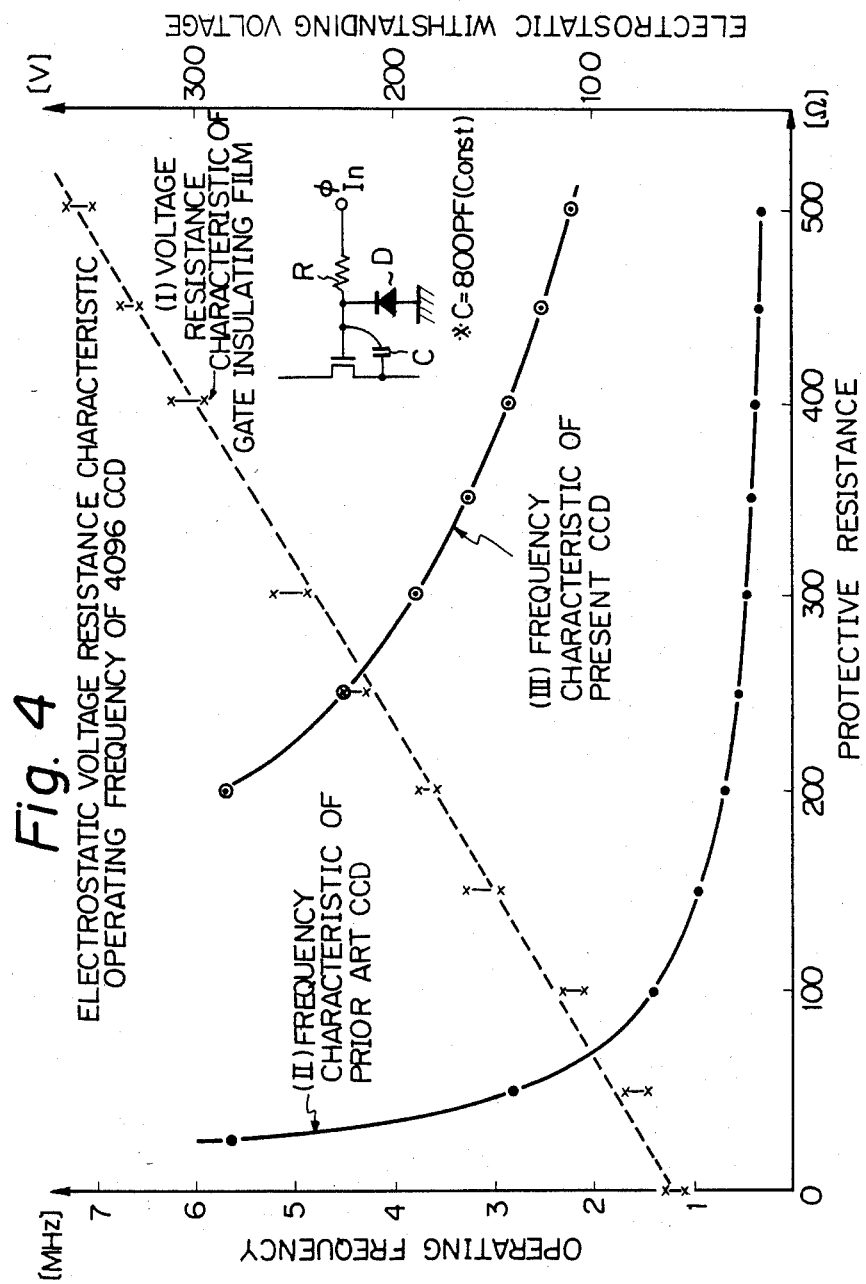
FIG. 4 is a graph showing the withstanding voltage of a gate insulating film and operating frequency characteristics versus resistance value of its protective resistor of a 4096 bit CCD.

For example, provided that a protective resistance value of the protective circuit is assumed to be 200Ω as shown in FIGS. 4(I) and (II), a maximum electrostatic withstanding voltage of about 180 V is produced.

For the operating characteristics of CCD devices, a prior art device in which divided gate electrodes are not connected with each other is operated at a low speed of about 0.7 MHz, while a CCD device according to the present invention is operated at about 5.7 MHz.

Conventionally, variations have been produced in the dark current of a CCD device because of localized heating in an IC chip due to a signal current concentrated through a protective resistor in a protective circuit.

However, in a CCD device according to the present invention, a signal current is dispersed and allowed to flow through a plurality of protective resistors, so that localized heating is reduced in an IC chip, allowing variations in the dark current to be reduced.

Figure 5:
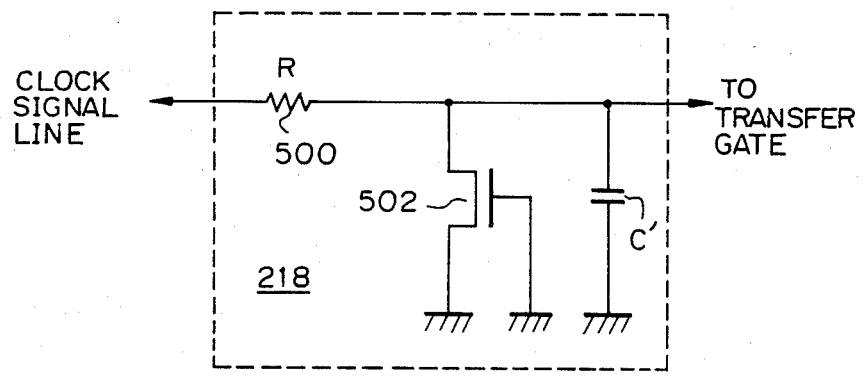
FIG. 5 is a circuit diagram showing an electrostatic protective means including a MOS transistor.

It is also possible to construct the protective means 218 according to the present invention with a protective resistor 500 and a MOS transistor 502 as shown in FIG. 5.

Although the number of protective means is increased in the embodiment according to the present invention described above, no problem occurs in practical use because of the extremely small area occupied by the individual protective means as compared with the whole area of the CCD chip.

A CCD device according to the present invention can be also applied to a multi-phase drive type CCD.

Advantages of the CCD device including groups of gate electrodes divided and connected mutually according to the present invention are as follows:

(a) the electrostatic withstanding voltage of the gate insulating film can be set higher without reducing its clock operating speed.

(b) since the protective resistors of the protective means are dispersed in the CCD IC chip, no localized heating is produced, thus allowing variations in the dark current to be reduced.

What is claimed is:

1. In a metal-oxide-semiconductor charge coupled device, MOS CCD, which operates in response to multi-phase clock signals, wherein a gate insulating layer is formed over a surface of a silicon semiconductor substrate having a first conductivity type, and a plurality of charge transfer gate electrodes are disposed over the surface of said gate insulating layer, said gate electrodes being serially arranged in N stages with N being an integer, and a plurality of drive clock signal lines are arranged over the surface of said gate insulating layer to receive said multi-phase clock signals, the improvement comprising: a plurality of protective means for preventing the breakdown of said insulating layer and arranged in the surface of said semiconductor substrate, said charge transfer gate electrodes being divided into n groups with n being an integer, said gate electrodes of each of said n groups being sub-grouped into a sub-group of a number corresponding to that of said drive clock signal lines, the sub-grouped gate electrodes being connected together so as to carry out a multi-phase clock operation, said protective means being divided into n groups, each of the grouped protective means being connected to said drive clock signal lines and said sub-grouped gate electrodes, respectively.

2. In a metal-oxide-semiconductor charge coupled device, MOS CCD, which operates in response to two drive clock signals, wherein a gate insulating layer is arranged over a surface of a silicon semiconductor substrate having a first conductivity type, and a plurality of charge transfer gate electrodes and serially arranged over a surface of said gate insulating layer in N stages with N being an integer, and two drive clock signal lines are arranged over a surface of said insulating layer to receive said two clock signals, the improvement comprising: a plurality of protective means for preventing the breakdown of said gate insulating layer and arranged in the surface of said semiconductor substrate, a plurality of said protective means being divided into n groups each of which comprises two protective means with n being an integer, one of said two protective means being coupled between one of said drive clock signal lines and a first connecting node and the other of said two protective means being coupled between the other of said clock signal lines and a second connecting node, said charge transfer gate electrodes being divided into n groups, said gate electrodes of each of said n groups being sub-grouped into sub-groups of two electrodes, the sub-grouped gate electrodes being connected together so as to carry out two phase clock operation and so as to be connected to said first and second connecting nodes, respectively.

3. An MOS CCD according to claim 2, wherein each of said protective means comprises a resistor element connected between one of said clock signal lines and one of said charge transfer gate electrodes, and a PN junction diode connected between said charge transfer gate electrode and a fixed power source potential for said semiconductor substrate, said resistor element comprising one of either an impurity diffusion resistor and a polysilicon resistor.

4. An MOS CCD according to claim 3, wherein said transfer gate electrode comprises a first layer polysilicon electrode and a second layer polysilicon electrode, and said silicon substrate includes a diffusion region of a second conductivity type which is opposite to said first conductivity type and is arranged in the surface of said silicon substrate under said second polysilicon electrode.

5. An MOS CCD according to claim 3, wherein said resistor element has a resistance value between 100 and 200 ohms.

6. An MOS CCD according to claim 2, wherein each of said protective means comprises a resistor element connected between one of said clock signal lines and one of said charge transfer gate electrodes, and an MOS transistor connected between said charge transfer gate electrode and a fixed power source potential for said semiconductor substrate, said resistor element comprising one of either an impurity diffusion resistor and a polysilicon resistor.

7. An MOS CCD according to claim 6, wherein said transfer gate electrode comprises a first layer polysilicon electrode and a second layer polysilicon electrode, and said silicon substrate includes a diffusion region of a second conductivity type which is opposite to said first conductivity type and is arranged in the surface of said silicon substrate under said second polysilicon electrode.

8. An MOS CCD according to claim 6, wherein said resistor element has a resistance value between 100 and 200 ohms.

* * * * *